US012596655B2

(12) United States Patent
Tarin

(10) Patent No.: US 12,596,655 B2
(45) Date of Patent: *\*Apr. 7, 2026**

(54) SYSTEMS AND METHODS FOR TRANSFORMING LARGE DATA INTO A SMALLER REPRESENTATION AND FOR RE-TRANSFORMING THE SMALLER REPRESENTATION BACK TO THE ORIGINAL LARGE DATA

(71) Applicant: Stephen Tarin, Redwood City, CA (US)

(72) Inventor: Stephen Tarin, Redwood City, CA (US)

(73) Assignee: Stephen Tarin, Redwood City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/316,050

(22) Filed: May 10, 2021

(65) Prior Publication Data

US 2021/0326269 A1 Oct. 21, 2021

Related U.S. Application Data

(63) Continuation of application No. 16/823,160, filed on Mar. 18, 2020, now Pat. No. 11,003,589, which is a
(Continued)

(51) Int. Cl.
*G06F 12/10* (2016.01)
*G06F 7/58* (2006.01)
(Continued)

(52) U.S. Cl.
CPC ............ *G06F 12/1054* (2013.01); *G06F 7/58* (2013.01); *G06F 11/076* (2013.01); *G06F 17/10* (2013.01);
(Continued)

(58) Field of Classification Search
CPC .... G06F 12/1054; G06F 11/076; G06F 17/10; G06F 12/10; G06F 7/58; G06F 2212/401;
(Continued)

(56) References Cited

U.S. PATENT DOCUMENTS 5,359,551 A 10/1994 Pickett
5,838,832 A 11/1998 Barnsley
(Continued)

FOREIGN PATENT DOCUMENTS

EP 1226444 B1 * 12/2003 ....... G01R 31/31813
JP 2005-51479 A 2/2005
(Continued)

OTHER PUBLICATIONS

A. Deepa and C. N. Marimuthu, "Microprocessor cache compressor design using p. Match algorithm," 2012 International Conference on Computer Communication and Informatics, Coimbatore, India, 2012, pp. 1-5.*
(Continued)

*Primary Examiner* — Pierre Michel Bataille
(74) *Attorney, Agent, or Firm* — Sheppard Mullin Richter & Hampton LLP

(57) ABSTRACT

A system transmits a target data file as a set of mathematical functions and data values representative of the target data file to a receiver, the system comprising at least one hardware processor and memory storing computer instructions, the computer instructions when executed by the at least one hardware processor configured to cause the system to identify a target bit pattern of a target data file; generate a set of mathematical functions and data values operative to generate the target bit pattern; and transmit the set of mathematical functions and data values to a receiver, which can use the set of mathematical functions and data values to generate the target data file.

2 Claims, 7 Drawing Sheets

Related U.S. Application Data continuation of application No. 16/019,513, filed on Jun. 26, 2018, now Pat. No. 10,621,108.

(60) Provisional application No. 62/658,432, filed on Apr. 16, 2018, provisional application No. 62/525,068, filed on Jun. 26, 2017.

(51) Int. Cl.
| | |
|---|---|
| *G06F 11/07* | (2006.01) |
| *G06F 12/1045* | (2016.01) |
| *G06F 17/10* | (2006.01) |
| *H03M 7/30* | (2006.01) |

(52) U.S. Cl.
CPC .............. *H03M 7/30* (2013.01); *H03M 7/55* (2013.01); *G06F 2212/401* (2013.01)

(58) Field of Classification Search
CPC ............... G06F 9/3802; G06F 9/30181; G06F 9/30047; G06F 12/0802; G06F 12/0842; G06F 9/30043; G06F 9/3004; G06F 9/30021; G06F 9/3834; H03M 7/30; H03M 7/55

See application file for complete search history.

(56) References Cited

U.S. PATENT DOCUMENTS

| | | | | | |
|---|---|---|---|---|---|
| 6,003,137 | A | * | 12/1999 | Kawasaki | .......... H04L 41/0893 |
| | | | | | 709/223 |
| 7,116,663 | B2 | * | 10/2006 | Liao | ................... H04L 63/0263 |
| | | | | | 708/211 |
| 7,181,591 | B2 | * | 2/2007 | Tsai | ......................... G11C 8/10 |
| | | | | | 711/212 |
| 7,266,661 | B2 | * | 9/2007 | Walmsley | ............... G06F 21/73 |
| | | | | | 711/164 |
| 7,558,941 | B2 | * | 7/2009 | Gabel | ................. G06F 12/0813 |
| | | | | | 714/719 |
| 7,707,371 | B1 | * | 4/2010 | Goheer | ............... H04L 67/1097 |
| | | | | | 711/111 |
| 7,930,494 | B1 | * | 4/2011 | Goheer | ................... G06F 21/62 |
| | | | | | 711/111 |
| 9,159,423 | B1 | | 10/2015 | Brahmadathan | |
| 9,584,154 | B2 | | 2/2017 | Hansen | |
| 2002/0154770 | A1 | | 10/2002 | Short | |
| 2003/0108043 | A1 | * | 6/2003 | Liao | ......................... H04L 45/00 |
| | | | | | 370/392 |
| 2006/0059196 | A1 | * | 3/2006 | Sato | ...................... H04L 45/742 |
| 2006/0061795 | A1 | * | 3/2006 | Walmsley | ............... G06F 21/73 |
| | | | | | 358/1.14 |
| 2007/0005890 | A1 | * | 1/2007 | Gabel | ................. G06F 12/0813 |
| | | | | | 711/3 |
| 2007/0168789 | A1 | * | 7/2007 | Udell | ............. G01R 31/318371 |
| | | | | | 714/724 |
| 2008/0040551 | A1 | * | 2/2008 | Gray | ..................... G06F 12/084 |
| | | | | | 711/E12.016 |
| 2008/0214300 | A1 | | 9/2008 | Williams | |
| 2008/0320336 | A1 | * | 12/2008 | Qadir | .................... G06F 11/079 |
| | | | | | 714/45 |
| 2009/0019269 | A1 | * | 1/2009 | Wolff | .................. G06F 9/30145 |
| | | | | | 712/E9.034 |
| 2015/0134915 | A1 | * | 5/2015 | de la Iglesia | ....... G06F 12/0802 |
| | | | | | 711/136 |
| 2015/0169462 | A1 | | 6/2015 | Vaisanen | |
| 2015/0186282 | A1 | * | 7/2015 | Rahme | .................. G06F 1/3225 |
| | | | | | 711/144 |
| 2015/0381201 | A1 | | 12/2015 | Ansari et al. | |
| 2017/0074620 | A1 | | 3/2017 | Roemerman | |
| 2017/0294913 | A1 | | 10/2017 | Chen | |

FOREIGN PATENT DOCUMENTS

| | | | |
|---|---|---|---|
| KR | 1020030076240 A | 9/2003 | |
| WO | WO-9722053 A1 * | 6/1997 | .............. G06F 11/10 |
| WO | 0199315 A2 | 12/2001 | |

OTHER PUBLICATIONS

"Improving Chip I/O Effectiveness by Memory Address Encoding and Decoding," IBM Technical Disclosure Bulletin, 1993.*

WO2019005888 IPER, Dec. 31, 2019, Tarin.

WO2019005888 ISR, Jan. 3, 2019, Tarin.

WO2019005888 Writ Opin, Jan. 3, 2019, Tarin.

International Application No. PCT/US2018/039620, International Search Report and Written Opinion dated Sep. 24, 2018, 6 pages.

European Application No. 18824155.8, European Search Report mailed Feb. 12, 2021, 13 pages.

Korean Application No. 10-2020-7002460, Notice of Allowance mailed May 17, 2021, 2 pages.

Anonymous, "Data compression", Wikipedia, Jun. 23, 2017 (Jun. 23, 2017), XP055769288, [retrieved on Jan. 27, 2021], 12 pages.

Anonymous, "Function (mathematics)", Wikipedia, Jun. 22, 2017 (Jun. 22, 2017), XP055769275, [retrieved on Jan. 27, 2021], 17 pages.

Anonymous, "Lossless compression", Wikipedia, Jun. 22, 2017 (Jun. 22, 2017), XP055769285, [retrieved on Jan. 27, 2021], 11 pages.

Grunwald, Peter et al., "Shannon Information and Kolmogorov Complexity," Centrum Wiskunde & Informatica (CWI), Jul. 22, 2010, 51 pages.

Pekhimenko, Gennady, et al., "Base-Delta-Immediate Compression", Proceedings of the 21st International Conference on Parallel Architectures and Compilation Techniques (PACT '12), Jun. 19, 2012 (Jun. 19, 2012), p. 377, XP055212242, New York, New York, USA, DOI: 10.1145/2370816.2370870, ISBN: 978-1-45-031182-3, 20 pages.

Lee, Jang-Soo, et al., "An On-Chip Cache Compression Technique to Reduce Decompression Overhead and Design Complexity", Journal of Systems Architecture, Elsevier BV, NL, vol. 46, No. 15, Dec. 31, 2000 (Dec. 31, 2000), XP004224632, ISSN: 1383-7621, DOI: 10.1016/S1383-7621 (00)00030-8, pp. 1365-1382.

Shannon, Claude E., "A Mathematical Theory of Communication," The Bell System Technical Journal, vol. 27, pp. 379-423, 623-656, 1948.

* cited by examiner

SYSTEMS AND METHODS FOR TRANSFORMING LARGE DATA INTO A SMALLER REPRESENTATION AND FOR RE-TRANSFORMING THE SMALLER REPRESENTATION BACK TO THE ORIGINAL LARGE DATA

PRIORITY CLAIM

This application is a continuation of U.S. Ser. No. 16/823,160 filed Mar. 18, 2020, which is a continuation of U.S. Ser. No. 16/019,513 filed on Jun. 26, 2018 by Stephen Tarin entitled "Systems and Methods for Transforming Large Data Into A Smaller Representation And For Re-Transforming The Smaller Representation Back To The Original Large Data", which claims priority to U.S. Provisional Application Ser. No. 62/525,068 filed on Jun. 26, 2017 by Stephen Tarin entitled "System and Method for Managing Data in a Computing System", and to U.S. Provisional Application Ser. No. 62/658,432 filed on Apr. 16, 2018 by Stephen Tarin entitled "System and Method for Managing Data in a Computing System", all of which are hereby incorporated by reference as if repeated verbatim hereafter.

TECHNICAL FIELD

Embodiments of the present invention related generally to data compression and decompression techniques.

BACKGROUND

Large data stores are expensive to store and take substantial time to transport across communication lines. It would be helpful to have systems and methods that can substantially reduce the size of a large data store to a smaller representation and return the smaller representation back to the original large data store.

SUMMARY

In some embodiments, the present invention provides a system comprising at least one processor with one or more cores; and memory including, in part, instructions to configure the at least one processor to perform a method, the method comprising: receiving a data set of a data length; determining a bit pattern of the data set; generating a reference set of bit patterns, the set being of a set length, the set length being equivalent to the data length, the set of bit patterns including every possible different bit pattern from all zeros to all ones; determining a first test bit pattern using a first bit pattern generation function applied to test data; determining a distance between the first test bit pattern and the bit pattern of the data set using a location of the first test bit pattern and a location of the bit pattern of the data set, the locations being relative to the reference set of bit patterns; iterating the first test pattern generation function in a direction of the bit pattern of the data set and combining the first test pattern generation function with at least one second test pattern generation function to determine a second test bit pattern applied to the test data; determining a distance between the second test bit pattern and the bit pattern of the data set using a location of the second test bit pattern and the location of the bit pattern of the data set, the locations being relative to the reference set of bit patterns; if the distance between the second test bit pattern and the bit pattern of the data set is within or equal to a threshold distance, generate an error function based on the threshold distance and provide bit pattern functions and the error function to reproduce the data set, the bit pattern functions being equivalent to the iteration of the first test pattern generation function and the combination of the first test pattern generation function with the at least one second test pattern generation function; and recovering the data set based on the bit pattern functions and the error function.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

DETAILED DESCRIPTION

Figure 1:
FIG. 1 is a block diagram depicting a system for transforming data between its larger representation and its smaller representation according to some embodiments.
Figure 1:
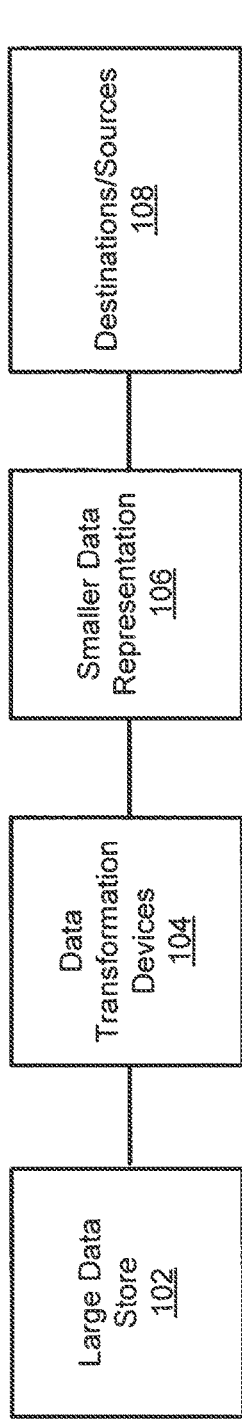

This invention provides a game changing solution to a series of long standing, seemingly intractable problems that have served to drastically limit the potential positive performance impact of forty plus generations of exponential hardware improvements under Moore's Law dating back to the invention of the Integrated Circuit and the appearance of the first microprocessors. These problems include the problem of big data together with the problem of network congestion and our inability to find useful applications for multi core architecture.

Central to the problem of big data, as it has been traditionally understood, lies the long standing, ever worsening, seemingly inevitable performance mismatch between high speed data processors and the cost of storing and transporting large volumes of data, where the cost of saving, storing, retrieving, and transporting large data stores has long since been swamping all other costs, thereby rendering the ongoing exponential increase in data processing speeds increasingly irrelevant to data throughput.

The powerful, radical breakthrough solution to the problem of big data that this invention provides derives from the fact that the availability of high speed microprocessors, together with the methods and apparatuses of this invention, obviate the need to continue to save, store, retrieve and transport large data stores, as this invention takes advantage of a hitherto hidden fundamental equivalence relationship between data processing and data storage in a manner that allows us to in a far faster, fail safe manner, rapidly recalculate large bit patterns from a far smaller kernel, rather than continuing to save, store and reuse large data stores, as had previously been required prior to the emergence of sufficiently rapid processors capable of preforming the necessary data recalculations in an adequately timely manner.

Similarly, the improvements in network congestion that this invention produces derive from the need to move less data around in order to recreate the same informational content via recalculation, while the highly significant revolutionary utility provided by multi core architecture derives from its ability to perform complex data recalculations far more rapidly when utilizing multi core architecture as a function of the number, speed and power of its cores.

The fundamental unit of data that both of the methods and apparatuses of this invention (as described directly below) operate upon is the bit pattern. Each bit pattern's informational content is first transformed via being spatially reduced to a highly compressed kernel, via the mechanism contained in a Data Compiler (hereinafter DC) as described below, in order to one or more times be subsequently recreated in its original format via recalculation from the contents of that kernel, via the mechanism contained in a Turing Dedekind device (hereinafter TD) as is likewise described below.

Embodiments of the current invention operate upon and allow for the recalculation of, while obviating the need to store, bit patterns. Each such bit pattern has a specific length, measurable in bits, so that any and all specific bit patterns K, of any and all specific lengths N, as measured by the number of bits it contains represents the fundamental unit of data, regardless of the content, purpose and/or utility of that data, that the methods and apparatuses of the current invention operate upon—thereby first enabling the DC to create the necessary kernel, including parameters and code, which occupies a far smaller spatial footprint, that the TD is then able to execute in order to rapidly losslessly in a practical fail safe manner recalculate the specific N bit long bit pattern K that was originally input into the DC, thereby enabling the aforementioned desirable results.

For the sake of simplicity, we shall for the purposes of this exposition consider such bit patterns to consist of classical mutually exclusive on or off binary digits traditionally represented by zeros and ones, but the methods and apparatuses of this invention are equally applicable of being implemented on data stored in other, not necessarily yet fully practical, but potentially vastly more efficient basic data representational units including but not limited to q bits and e bits with the ability to know how to implement this invention in multiple possible alternate data representational realms, including but not limited to the realm of quantum computing utilizing (non-binary, non-simple 'on is not off') q bits and e bits, that is capable of being accomplished by those trained in such state of the art practice.

Likewise, the methods and apparatuses of this invention are capable of being implemented in hardware, software or via other mechanisms such as firmware and/or microcode and/or any combination thereof. Moreover, multiple embodiments of this invention in various possible combinations in part or all of some or any of the following media/devices/implementations, etc., in hardware software, firmware, and/or microcode, etc., (including any and all possible various hybrid implementations based upon any possible practical workable combination of the any or all of the above possibilities) can also accommodate varying possible degrees from minimal to extensive partial human intervention and possible human or other non-computerized contributions, so that any possible partial human and/or other non-computerized contribution and/or other input, or intervention (or none at all) into any device, apparatus and/or method implemented in any possible practical workable combination of hardware, software, firmware, microcode, and/or any other computerized implementations methods and/or apparatuses of at least some part or all of the body and contents of the embodiments of the present invention as described herein (including or not including any possible or potential partial human intervention) constitute a practical embodiment of the present invention.

A significant, practical impediment to the discovery of the methods and apparatuses of the present invention lies in fundamental aspects of modern day information, data entropy, compression and complexity theory, manifest in long accepted, previously unquestioned but provably erroneous interpretations of Shannon's limit and Kolmogorov complexity theory (including simplified expositions commonly referred to as the counting argument or pigeonhole principle), which if veridical would render the present invention unachievable.

Thus, according to still frequently encountered interpretations, Shannon's limit establishes a seemingly absolute, inviolable, rigorously mathematically proven limit to data compressibility, which establishes redundancy reduction as the sole available means of lossless data compression, thereby rendering all randomized bit patterns inherently uncompressible. Yet, herein, we identify an arbitrarily large number of counter examples to invalidate this assertion. Shannon's seminal 1948 paper (which the adherents of the above false assertions agree was responsible for originally establishing and placing on a firm footing, modern day information, data entropy, compressibility, and communication theory) entitled "A Mathematical Theory of Communication" that was originally published in "The Bell System Technical Journal" Volume 27 pp. 379-423 and pp. 623-656, in July and October of 1948 and which is now available on line at: http://math.havard.edu/~ctm/home/text/others/shannon/entropy/entropy.pdf, clearly refutes the aforementioned false assertions that have long since been attributed to him, including doing so by specifically referencing one of the counter examples that directly refute it.

Shannon's data entropy theory rests entirely upon a stochastic analysis utilizing Markov chains, whose probabilistic terms reference our knowledge of the data in question so that any bit pattern that is known to us has no theoretical restriction on it being recalculated from a highly compressed kernel, which Shannon illustrates via the example of calculating pi, the digits of which have since been demonstrated to be almost perfectly randomized out to at least its first 22 trillion plus decimal digits.

Thus, Shannon specifically states his assumption that the stochastic analysis at the core of his data entropy theory rely on the assumption that the specific data stream being transmitted is not fully known in the second paragraph of his paper as follows: "The fundamental problem of communication is that of reproducing at one point either exactly or approximately a message selected at another point. Frequently, the messages have meaning; that is they refer to or are correlated according to some system with certain physical or conceptual entities. These semantic aspects of communication are irrelevant to the engineering problem. The significant aspect is that the actual message is one selected from a set of possible messages. The system must be designed to operate for each possible selection, not just the one which will actually be chosen since this is unknown at the time of design." (http://math.havard.edu/~ctm/home/text/others/shannon/entropy/entropy.pdf, pg. 1)

Shannon then proceeds to specifically provide pi as a counter example proving that no such theoretical restrictions hold if the specific contents of the data is known in advance at the time of transmission, as follows: "If a source can produce only one particular message its entropy is zero, and no channel is required. For example, a computing machine set up to calculate the successive digits of $\pi$ produces a definite sequence with no chance element. No channel is required to 'transmit' this to another point. One could construct a second machine to compute the same sequence at the point. However, this may be impractical. In such a case we can choose to ignore some or all of the statistical knowledge we have of the source." (http://math.havard.edu/~ctm/home/text/others/shannon/entropy/entropy.pdf, pg. 18).

Moreover, such still frequently repeated false assertions claiming that Shannon's limit establishes an absolute, inviolable, rigorously mathematically proven limit to data compressibility, which establishes redundancy reduction as the sole available means of lossless data compression, thereby rendering all randomized bit patterns inherently uncompressible, are at least now fairly commonly contradicted by contemporary scholarly articles that pay sufficient attention to the aforementioned quotes in the context of the totality of Shannon's 1948 paper such as a paper entitled "Shannon Information and Kolmogorov Complexity" by Peter Grunwald and Paul Vitanyi dated Jul. 22, 2010, which follows up quoting in its entirety the first of the two Shannon quotes we presented above by explicitly stating its implication that "for every source emitting but two messages the Shannon information is at most one bit" even though "we can choose both messages concerned of high Kolmogorov Complexity" (pg. 2).

Further, while the above quoted statement is certainly sufficiently crisp and clear in its own right, these two authors go on to still further clarify the underlying issues involved here far more generally and rigorously by stating: "It seldom happens that a detailed mathematical theory springs forth in essentially final form from a single publication". Such was the case with Shannon information theory, which properly started only with the appearance of C. E. Shannon's paper "The mathematical theory of communication" (sic). In this paper, Shannon proposed a measure of information in a distribution, which he calls the 'entropy'. The entropy H (P) of a distribution P measures 'the inherent uncertainty in P', or (in fact equivalently), 'how much information is gained when an outcome of P is observed'. To make this more precise, let us imagine an observer who knows that X is distributed according to P. The observer then observes X=x. The entropy of P stands for the 'uncertainty of the observer about the outcome x before he observes it'. Now think of the observer as a 'receiver' who receives the message containing the value of X. From this dual point of view, the entropy stands for the average amount of information that the observer has gained after receiving a realized outcome x of the random variable X." (pg. 8), which the authors further follow up by providing Shannon's mathematical definition of entropy in the following language. "Let be a finite or countable set, let X be a random variable taking values in $\mathfrak{X}$ with distribution P (X=x)=px. Then the (Shannon-) entropy of random variable X is given by H (X)=$\Sigma$x$\epsilon\mathfrak{X}$ px log 1/px." (pg. 8), which the authors further clarify by stating "Entropy is defined here as a functional mapping random variables to real numbers. In many texts, entropy is, essentially equivalently, defined as a map from distributions of random variables to the real numbers. Thus, by definition: H (P):=H (X)=$\Sigma$ x$\epsilon\mathfrak{X}$ px log 1/px." (pg. 8).

The situation gets more complicated, however, when it comes to the still virtually universally accepted, but highly primitive and equally flawed understanding of Kolmogorov Complexity, due to the fact that the core arguments as represented by the counting argument/pigeonhole principle versions of our still currently accepted understanding of Kolmogorov Complexity exhibit at least four major fallacies.

Thus, the core commonly held understanding of Kolmogorov Complexity which resides in the claim that the necessity of uniquely being able to map a compressed form of any bit pattern back on to the original non-compressed form of the same bit pattern which necessarily contains $2^N$ possibilities in every bit pattern of length N bits, imposes the requirement that only 1/256 possible such bit patterns can be compressed by 1 byte, while only 1/65,536 possible such bit patterns can be compressed by 2 bytes, etc., which is commonly asserted with such unquestioned, self-proclaimed seemingly obvious self-evident assuredness, completely fails to impose any such draconian limitations for at least all four of the following reasons.

First, the argument that a bit patterns containing N bits can itself only serve to distinguish $2^N$ possible unique distinct separate bit patterns can at best only be utilized to try to claim that in order to attempt to uniquely distinguish more than $2^N$ distinct bit patterns containing N bits would require the use of additional criteria. Yet, this falls far short of the clearly logically unwarranted assertion that is nonetheless made, solely on this basis that no such further distinguishing characteristics can possibly exist. Consider, for example, a situation in which one wants to distinguish between three light bulbs each of which are controlled by a single unitary, binary choice on/off light switch, itself capable of representing only one bit of binary informational content. According to the clearly overly simplistic claims made by the advocates for the pigeonhole principle/counting argument, such an apparatus is only capable of distinguishing between two separate light bulb states—on and off. Yet, by leaving one switch off, turning one switch on immediately and simply waiting long enough before turning the third switch on provides sufficient informational content to distinguish between the three separate distinct light bulb states of off, on and cold, and on and hot. It has similarly long been known and utilized that bit patterns sent over communications lines can be further distinguished from each other by such characteristics as frequency, signal intensity, etc., in addition to the $2^N$ possible distinct informational content states based solely on bit patterns, and embodiments of the present invention likewise provides means of distinguishing the informational content contained within two or more separate but bit-content-identical bit patterns via the use of such factors as the virtual memory addresses at which these bit patterns are stored and the time stamps indicating the time certain operations were performed on these bit patterns.

Second, under conditions where N bits can be divided up into K separate configurations each of which contain different percentages of operation codes versus data, each such configuration can contain $2^N$ distinct bit patterns so that the actual cumulative total of distinct separate bit patterns capable of being produced by all these possible configurations taken jointly will be determined by such factors as the number of duplicate results and whether specific operations are commutative, under conditions where there is clearly no reason to expect that the cumulative sum total number of all such possible results won't exceed $2^N$ distinct bit patterns.

Third, our traditional understanding of Kolmogorov complexity treats each compressed bit pattern as an independent self-contained unit. Yet, our ability to create theoretically arbitrarily large compression ratios out of extremely small kernels creates a large number of equivalence relationships establishing a tradeoff where the ability to compress a small number of extremely compressed bit patterns can be "traded in" for the ability to create a vastly larger number of somewhat less compressed bit patterns in a manner that can be roughly intuitively viewed as the exponential relationship that the counting argument/pigeonhole principle rests on, running in reverse and/or turning against itself. Thus, for example, the ability to create N separate say trillion-to-one compression ratios by taking successive powers of a very small number of bits or via achieving similar ratios via executing other loops with large indexes and a small number of parameters with a short spatial footprint creates a situation a) in which all numeric differences between, and/or other simple functional combinations between any two or more such highly compressed bit strings produce a far larger new set of almost equally highly compressed bit strings, b) in which this or other similar operations as described in a) above can be performed recursively leading to a further combinatorial explosion of highly compressed bit patterns with each iteration, and c) in which the additional operation of any possible function that can be described in, for example, one kilobyte creates $2^{8000}$ separate times the sum total of bit patterns produced by the operations described in a) and b) above, each of which will manifest a roughly one-billion-to-one compression ratio.

Fourth, in order to create a practical compression mechanism, it is necessary to create a functionally achievable mapping capable of uniquely distinguishing whatever specific distinct bit patterns we will actually encounter under conditions where the Kolmogorov complexity of that number will almost certainly be far less than 20 bytes, noting that it would take a computer capable of performing $10^{24}$ operations per second running day and night between two to three million times the current estimate of the age of the universe since the big bang to exhaust the combinatorial complexity of just 20 bytes.

The hitherto hidden bidirectional storage calculation equivalency relationship originally presaged by the so called Von Neumann architecture establishing the existence of stored program computing reaches full fruition via taking advantage extremely fast microprocessors to calculate data, thereby clarifying that the problem of big data as described above derives not from the inevitable consequence of the high cost of storing and transporting extremely large data stores, but rather from our continuing to represent and process data in modern computer systems in a manner that was designed based on the abilities and limitations of vastly more primitive machines dating back to the dawn of computer science prior to the advent of the Integrated Circuit and Moore's law—producing the critical complex of long commonly held erroneous principles that greatly negatively impacted the fields of information, data entropy, compressibility and complexity theory as shown above.

Freed from the legacy impact of these false limitations (analogous to the commonly held view post WWII that space flight was impossible because the weight of the fuel required to reach orbit prevented escape velocity from being reached, which false limitation was solved by the multi stage rocket) the existence of sufficiently fast processors enables data to be calculated rather than stored via the methods and apparatuses of DC and TD in a relatively straightforward conceptual manner as described below.

FIG. 1 is a block diagram depicting an example of a data transformation system 100 according to some embodiments. The data transformation scheme 100 includes a large data store 102, data transformation devices 104, a smaller data representation 106, and destinations/sources 108. In data transformation to a smaller representation, a sequence flows from the large data store 102 toward the destinations/sources 108. In data re-transformation back to the large data store, a sequence flows from the destinations/sources 108 to the large data store 102. In some embodiments, the Data Compiler (DC) described herein may be referred to as a "transformation device", and the Turing Dedekind device (TD) described herein may be referred to as a "re-transformation device".

The large data store 102 represents data in non-compressed, unaltered form. The large data store may include raw data. In some embodiments, the large data store 102 is to be processed by a processor of a computer system for carrying out intended operations based on the large data store 102. In some embodiments, the large data store 102 may include user data, such as documents, images, pictures, video, and audio, etc., to be processed by the processor and presented to users. In some embodiments, the large data store 102 may include program files including instructions to be executed by the processor to perform an operation instructed by the instructions. In some embodiments, the large data store 102 may include system data for managing hardware and software resources managed by the computing system. The large data store 102 may be stored in memory, persistent storage, or in combinations thereof. The large data store 102 may be consumed in portions by the computing system.

The data transformation devices 104 includes a device (e.g., a DC) for data transformation to the smaller representation and a device (e.g., a TD) for re-transformation back to the original large data store. When data transformation is carried out, the large data store 102 is transformed into the smaller data representation 106. According the present disclosure, transformation techniques described in this paper are employed to generate the smaller data representation 106. When data re-transformation is carried out, the smaller data representation 106 is re-transformed back into the large data store 102 using the reverse of those techniques. According to the present disclosure a largely expandable data transformation technique corresponding to the transformation technique is carried out using specific data transformation algorithms. The specific techniques for data transformation and re-transformation are described herein.

The smaller data representation 106 represents data in small footprint that can be reproduced back to the large data store. The smaller data representation may include transformed data as a result of data transformation through the data transformation devices 104 and a smaller data representation obtained from data sources 108.

In some embodiments, the destination 108 may represent a datastore (e.g., memory, persistent storage, removable storage, or cache) in which the smaller data representation 106 generated as a result of data transformation is received. In some embodiments, the data source 108 may represent a datastore (e.g., memory, persistent storage or cache) from which smaller data representation 106 to be re-transformed is obtained. In some embodiments, the destinations/sources 108 may include a local storage drive, including internal storage devices integrated with a computing system and removable external storage devices connected to the computing system. The internal storage devices may include optical drive, hard disk, and solid state drive, and so on. The removable external storage devices may include a memory card (e.g., SD card), a memory stick (e.g., USB memory), and so on. In some embodiments, the destinations/sources 108 may include external computing systems connected to a local computing system that performs the data transformation over a computer network. The external computing systems may include cloud server systems, server systems dedicated for specific entity, client computing systems, and so on. In some embodiments, the destination/source 108 may include a data transport layer capable of transmitting or receiving the smaller data representation.

Figure 2:
FIG. 2 is a block diagram that illustrates a computer system upon which one or more of data transformation operations described herein may be implemented according to some embodiments.
Figure 2:
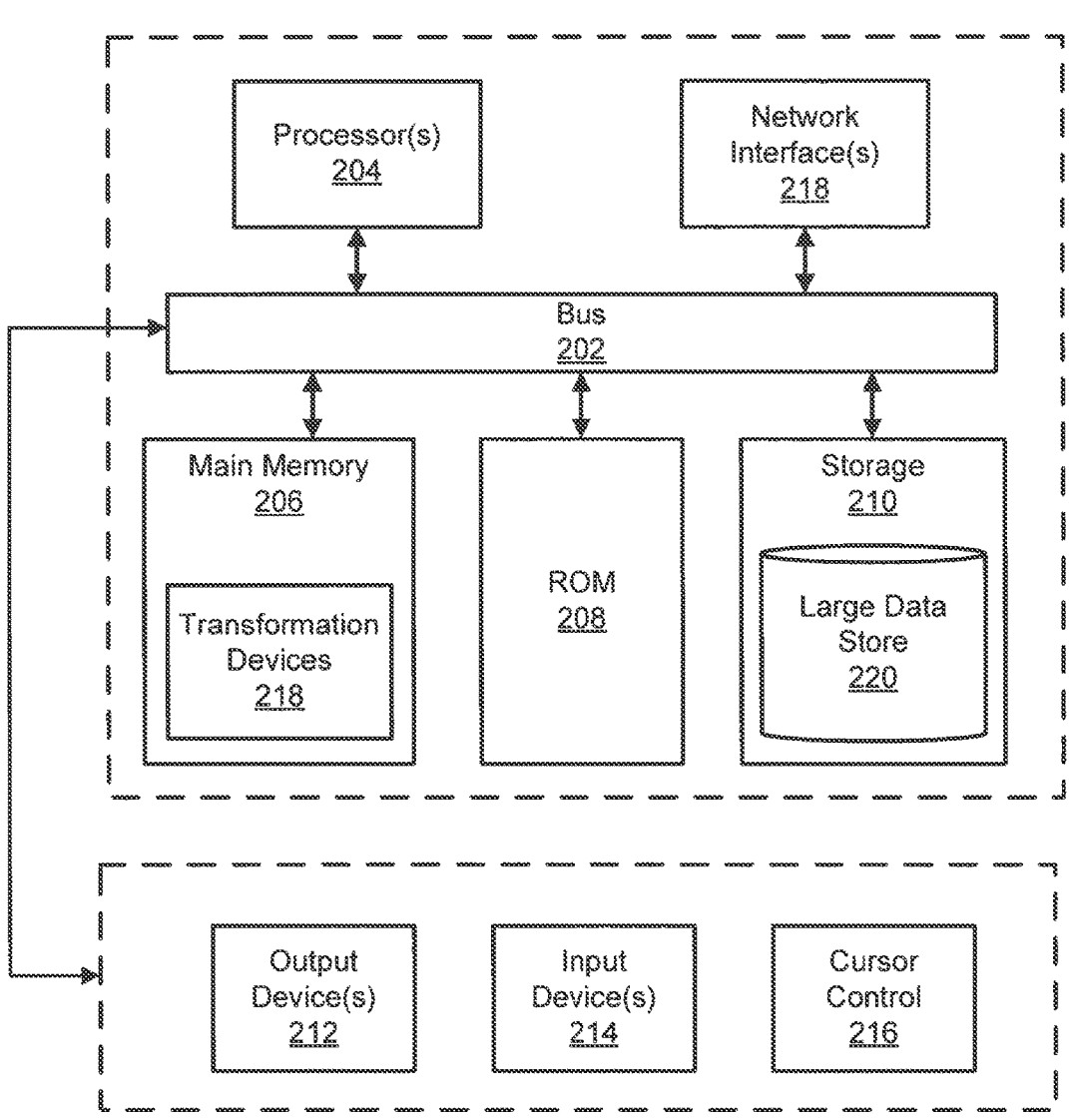

FIG. 2 is a block diagram that illustrates a computer system 200 upon which one or more of data transformation operations according to the embodiments described herein may be implemented. The computer system 200 includes a bus 202 or other communication mechanism for communicating data, one or more hardware processors 204 coupled with the bus 202 for processing data. The hardware processor(s) 204 may be, for example, one or more general purpose microprocessors or one or more specific purpose microprocessors. As noted herein, the processors 204 may be a multi-core processor. The hardware processor(s) 204 may be configured to execute a data transformation engine 218 therein, which will be described below.

The computer system 200 also includes a main memory 206, such as a random access memory (RAM), cache and/or other dynamic storage devices, coupled to the bus 202 for storing temporary data and instructions to be executed by the processor(s) 204. The instructions include the data transformation engine 218 configured to cause the processor(s) 204 to transform data (original) into the smaller data representation and re-transform the smaller data representation into the large data store according to data transformation algorithms described in the present disclosure. The main memory 206 also may be used for temporarily storing re-transformed data generated by executing the data transformation engine 218, such that the processor(s) 204 can process the re-transformed data. Such instructions, when stored in storage media accessible to the processor(s) 204, render the computer system 200 into a special-purpose machine that is customized to perform the operations specified in the instructions.

In general, the word "engine" may constitute either software engines (e.g., code embodied on a machine-readable medium) or hardware engines. A "hardware engine" is a tangible unit capable of performing certain operations and may be configured or arranged in a certain physical manner. In various example embodiments, one or more computer systems (e.g., a standalone computer system, a client computer system, or a server computer system) or one or more hardware engines of a computer system (e.g., a processor or a group of processors) may be configured by software (e.g., an application or application portion) as a hardware engine that operates to perform certain operations as described herein.

The computer system 200 further includes a read only memory (ROM) 208 or other static storage device coupled to the bus 202 for storing static information and instructions for the processor(s) 204. Depending on a specific implementation, the data transformation engine 218 may be loaded to the main memory 206, when the processor(s) 204 carries out a data transformation operation.

A storage device 210, such as a magnetic disk, optical disk, or USB thumb drive (Flash drive), etc., is provided and coupled to the bus 202 for storing data and instructions. The storage device 210 includes a large data store 220.

The computer system 200 may be coupled via the bus 202 to output device(s) 212, such as a cathode ray tube (CRT) or LCD display (or touch screen), for displaying information to a computer user. Input device(s) 214, including alphanumeric and other keys, are coupled to the bus 202 for communicating information and command selections to the processor(s) 204. Another type of user input device is a cursor controller 216, such as a mouse, a trackball, or cursor direction keys for communicating direction information and command selections to the processor(s) 204 and for controlling cursor movement on the output device(s) 212. This input device 214 typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

The computing system 200 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

The computer system 200 may implement the techniques described herein using customized hard-wired logic, one or more ASICs or FPGAs, firmware and/or program logic which in combination with the computer system causes or programs the computer system 200 to be a special-purpose machine. According to some embodiments, the techniques herein are performed by the computer system 200 in response to the processor(s) 204 executing one or more sequences of one or more instructions contained in main memory 206. Such instructions may be read into the main memory 206 from another storage medium, such as the storage device 210. Execution of the sequences of instructions contained in the main memory 206 causes the processor(s) 204 to perform the process steps described herein. In alternative embodiments, hard-wired circuitry may be used in place of or in combination with software instructions.

The computer system 200 also includes a communication interface 218 coupled to the bus 202. The communication interface 218 provides a two-way data communication coupling to one or more network links that are connected to one or more local networks. For example, the communication interface 218 may be an integrated services digital network (ISDN) card, cable modem, satellite modem, or a modem to provide a data communication connection to a corresponding type of telephone line. As another example, the communication interface 218 may be a local area network (LAN) card to provide a data communication connection to a compatible LAN (or WAN component to communicated with a WAN). Wireless links may also be implemented. In any such implementation, the communication interface 218 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet". Local network and Internet both use electrical, electromagnetic or optical signals that carry digital data streams. The signals through the various networks and the signals on network link and through communication interface 218, which carry the digital data to and from computer system 200, are example forms of transmission media.

The computer system 200 can send messages and receive data, in particular, smaller data representation, through the network(s), network link and the communication interface 218. In the Internet example, a server might transmit a requested code for an application program through the Internet, the ISP, the local network and the communication interface 218.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The data transformation devices 104 operates to transform and re-transform data as generally as described herein.

The term "data compiler" is edifying in so far as optimizing compilers transform computer code from a more readily human understandable but far more highly machine inefficient format into a functionally equivalent far more highly computer efficient but roughly correspondingly far less easily humanly understandable format, whereas the Data Compiler (DC) as described herein perform an analogous functionality by transforming data in the form of highly computer inefficient bit patterns (that are extremely costly to store and move around) into a far smaller kernel that can fit entirely or largely into a machine's on chip cache that provide CPU, graphics, or other processing entity the ability to rapidly losslessly recalculate the original bit pattern that was originally input into the data compiler, while a corresponding Turing Dedekind device (TD) performs the requisite high speed lossless recalculation of this original bit pattern from the kernel that the DC produced. Notably, it is useful to consider the process the DC performs as "load time" and to likewise consider the process the TD performs as "run time".

Similarly, the term "Turing Dedekind device" derives from the method the TD uses to perform this recalculation in a manner that can usefully be conceptualized by considering key methodological design features that it possesses, which are highly reminiscent of both a Turing Machine and a Dedekind Cut. It is useful to consider a specific bit pattern K containing N bits, in a manner that draws attention to its combinatorial complexity and the manner in which the TD recalculates it from a highly compressed kernel by high speed processors (e.g., processors 204) via the specific example of a more general purpose method designed to reproduce exactly this particular bit pattern K that had previously been determined to be sufficiently efficient by the DC at load time by considering a line segment in which each consecutive point from left to right represents the bit pattern $K_1$ equal to the numerical value of $K_0$ plus one where $K_0$ represents the point immediately to the left of it on this line segment, where the first point in the left most position on this line segment represents the N bit long bit pattern containing all off bits and the last point in the right most position on this line segment represents the N bit long bit pattern containing all on bits (i.e., where each line segment contains precisely $2^N$ distinct points) where each specific significant N bit long bit pattern K that TD has been specifically configured to losslessly reproduce through a specific recalculation performed by one or more high speed processors via a specific instruction set operating on a specific kernel, which had both been previously designed for this purpose by a DC according to the methods described below and/or via an alternative and/or variant method capable of being designed and/or performed by one trained in the art either in a completely automated fashion by a computing device and/or alternatively with one or more of these steps being performed with the aid of human intervention represents a Dedekind cut in this line segment.

Moreover, another reason for rendering it particularly appropriate to considering each specific such bit pattern K as a Dedekind cut in this line segment in addition to drawing attention to the combinatorial complexity involved in this process as is achieved via each line segment containing $2^N$ points (which is all the more relevant and illuminating given the long standing, still currently accepted provably erroneous understanding of Kolmogorov Complexity referenced above) derives from the reality that in almost all cases the method of recalculating bit pattern K that had previously been established by the DC at load time in order to be performed by the TD at one or more run times will not permit one to losslessly recalculate K directly but rather will enable one to calculate some other bit pattern J sufficiently close to K so that K can be losslessly reproduced repeatedly from a highly compressed kernel which calculates J from which K is then derived via the addition or subtraction or some other simple function of an error term converting J into K, under conditions where the smaller the absolute value of the difference between J and K the better the initial approximation and the smaller the error term, again drawing attention to the properties of a Dedekind cut, while exhibiting a method these devices in the most typical case share on the most general level of comparison with methods used by devices designed to implement a classical bidirectional transform such as a Fourier Transform.

Likewise, the manner in which bit patterns such as J and K are recalculated are reminiscent of a Turing Machine in so far as the process by which the TD recalculates J and/or K is via an accumulation process that may or may not be monotonic—which corresponds to a Turing Machine's ability to move a tape either unidirectionally or back and forth—proceeding at a known rate—so that key to the ability of the TD to losslessly reproduce K most efficiently lies in the ability of the DC to derive increasingly more accurate approximations with smaller error terms, the most efficient of which will most typically be executed by the TD at run time which based on the accumulation rate required to reproduce J precisely repeatedly being known to the system, the method by which the TD stops accumulating when it has produced the bit pattern J corresponds conceptually to a Turing machine moving a tape unidirectionally or back and forth in the exact proper predetermined manner combined with knowing the right time to halt.

Given that the essential function of the TD is to execute at run time the procedure necessary to perform the requisite recalculation that had already been established by the DC at load time the above brief exposition together with the description of a detailed enabling embodiment presented herein provides more than sufficient information for one skilled in the art to be able to implement a TD.

In contrast with the TD, which is the conceptually simpler of these two devices in so far as it "simply" executes the code against the kernel, both of which are handed to it by the DC, in order to recreate either some distinctly specified subset or the totality of the bit pattern that was originally input into the DC, the DC needs to "perform the heavy lifting" including determining both the kernel and the code operating on it for each bit pattern K it receives, which kernel and code the DC needs to design and create for the express purpose of eliminating the need to store bit pattern K which is now replaced with the ability of a TD to recalculate K, utilizing high speed processors, from a far smaller kernel which the DC needs to provide to the TD, together with the code, that DC likewise needs to provide which likewise exhibits a sufficiently small spatial foot print, that enables the TD to convert the highly compressed kernel which the DC has handed it back into the original bit pattern K in a vastly more machine efficient manner than the traditional legacy process of saving, storing and transporting and retrieving "as is" the original, typically far larger bit pattern K.

Note that the term "kernel" can be reasonably used to reference either the parameters and the code operating on it or alternatively solely the parameters that the code operates on without this potentially ambiguous dual meaning ever becoming a potential or actual source of confusion as long as it is made clear in each and every such specific instance, either explicitly, or implicitly via context, in which of these two distinct ways the term "kernel" is being used.

More substantively with regard to the actual operations of the DC, we take note, preliminarily, of the following three points, each of which prove useful in enabling one skilled in the art to create two separate types of enabling embodiments of a DC, using two distinct methods, as we shall see below.

First, importantly, given the existence of sufficiently fast processors together with adequate data integrity checks as referenced above, further capabilities are required to enable one trained in the art to produce a DC. These consist of a) the capability of losslessly accurately and rapidly recalculating a significant number but a nonetheless proportionately tiny subset of large uncompressed bit patterns (including doing so via a loop from a far smaller highly compressed kernel) which intuitively corresponds to a sort of "pump priming" and b) the ability to target any specific bit pattern K containing N bits so that that either that specific bit pattern K or some other bit pattern J, sufficiently close to K, can be losslessly recalculated in a manner that enables recalculating a series of successive such $J_a$'s, that asymptotically approach K, while keeping both the kernel and the requisite code necessary to recalculate the original bit pattern from this compressed kernel sufficiently small to enable a sufficiently significant subset of, or more beneficially, the totality of this code and this kernel to fit inside of a microprocessor's on chip cache.

Second, two entirely distinct independent methods of achieving both goals a) and b) in order to implement a DC exist, as shown below, under circumstances where the utilization of either one of these two distinct methods constitutes an enabling embodiment of the present invention while the currently known preferred embodiment of the present invention utilizes both methods together.

Third, these two distinct independent methods that the DC utilizes separately or jointly to accomplish the requisite dual functionalities a) and b) as referenced directly above rely on two out of the four separate issues previously referenced that the traditionally accepted erroneous interpretations of Kolmogorov complexity failed to recognize wherein the first method of implementing a DC described below takes direct advantage of the ability to create arbitrarily large theoretical compressibility together with the existence of the series of equivalence relationships jointly referenced in the third objection to the traditional overly draconian interpretation of Kolmogorov complexity (which dual capabilities exhibit an extremely close non accidental conceptual correspondence to the dual aforementioned required key a) and b) functionalities), while the second method of independently singly and/or jointly implementing these dual key a) and b) functionalities still more efficiently utilize the methods of distinguishing the informational contents of identical bit patterns via such properties as virtual memory addresses and times stamps as referenced in our exposition of the first of these four aforementioned problems with the critically flawed legacy interpretation of Kolmogorov complexity presented above.

With the benefit of the above preliminary considerations which serve to produce a DC, we turn directly to a consideration of the techniques employed (in order by each of these two distinct methods utilized by the present invention to implement a DC) to achieve the two key dual functionalities a) and b) above in a manner that enables the creation of a fully functional DC.

First, within the first embodiment of a DC, the creation of a proportionately small number of all possible size N bit patterns that nonetheless represents a relatively large numeric set of distinct separate, arbitrarily large bit patterns from an extremely small kernel whose arbitrarily large theoretical compression ratio is practically limited only by the speed of our processors and the time needed to perform the requisite calculation is easily achievable by one trained in the art via a loop containing a small spatial footprint and few lines of code through numerous iterations as indicated by a large index.

If deemed useful, moreover, the speed of the overall calculation and the subsequent ability to produce still larger arbitrary bit patterns ever more rapidly can be further improved not just through additional parallelization and multi core architecture but also via ignoring carries across arbitrarily sized word boundaries at the cost of a slight decrease in our already very large compression ratios. This procedure, which also serves to increase further parallelization via a decrease in functional dependencies, is achievable due to the fact that the sole requirement of our calculations is consistent bit pattern reproducibility, not mathematical accuracy.

Perhaps the simplest such loop is a floating point number of any base to any large power. Other such efficacious loops include but are not limited to raising X to the N power recursively k times for potentially large K, periodic alterations of a loops inner contents via increasing decreasing or otherwise functionally transforming one or more parameters within the loop every k iterations including but not limited to, for example, the exact analogue to the generating function of the Mandelbrot Set performed in the real rather than the complex plane, any calculation modulo m, any average, weighted average, numeric difference between or other simple function of any combination of two or more generating functions, the inclusion of additional terms containing constants, in addition to various possible bit shifting operations, bit pattern inverting, cutting and/or splicing and/or concatenations of different bit pattern segments, in addition to performing other simple logical and/or other mathematical operations together with numerous other variants recognizable and/or discoverable to those trained in the art, all of which possibilities can be further expanded by the inclusion of even significantly large error terms or error functions which are roughly intuitively equivalent to reversing the pigeonhole principle/counting argument starting from the standpoint of a significant number of extremely large, highly compressed distinct bit patterns that nonetheless represents a minuscule portion of its total Kolmogorov complexity.

Note to avoid potential confusion, the various parameters k referenced herein are not meant to indicate and have no necessary functional or other relationship to the bit pattern K as originally input into the DC.

We shall hereafter refer to a set of two or more of such typically highly compressed small spatial footprint high index loops as described directly above or any such other calculation mechanism that more or less ideally approximates the directly above listed criteria, as a HCSSFHIL (pronounced HICKS-FILL or HICKSVILLE or LONG ISLAND), while hereafter referring to each distinct calculation unit within a HCSSFHIL, which calculation units are perhaps best and most efficaciously illustrated by the types of highly compressed, small spatial footprint high index loops that include but are not necessarily limited to the examples described in the immediately preceding paragraph, as a "LOOP" regardless of whether or not the totality of the contents of each of these more or less ideally highly compressed small spatial foot print high index loop calculation units is or is not completely contained within a single loop or within two or more nested loops.

While a HCSSFHIL, by definition can contain any number of LOOPS greater than one, the number of LOOPS in each HCSSFHIL in the preferred embodiment of this invention is determined by practical optimization efficiency considerations under circumstances in which more LOOPS per HCSSFHIL provides a more efficient targeting mechanism at the cost of more processing steps in the TD.

Thus, while the simplest means of connecting two or more loops to form such a HCSSFHIL that likewise provides the simplest illustrative example of the operations performed by a DC to combine multiple loops into a HCSSFHIL consists of summing the numeric value of the output of each of the loops in that HCSSFHIL to produce the resultant bit pattern corresponding to that specific HCSSFHIL whose associated numeric value is equal to the sum of the distinct separate numeric values output by each of the LOOPS inside that particular HCSSFHIL, any other means of connecting multiple loops together to produce a HCSSFHIL could be utilized to connect two or more loops together to form a HCSSFHIL. Thus, any alternative function other than addition that combines multiple bit patterns produced by two or more LOOPS together to produce a typically significantly longer distinct bit pattern whose numeric value corresponds to the numeric value of the bit pattern produced by the HCSSFHIL as a result of executing these one or more of these alternative, not necessarily additive functions against the contents of the output of the particular multiplicity of LOOPS inside each HCSSFHIL is capable of providing the connecting mechanism that the DC utilizes to turn multiple LOOPS into a HCSSFHIL.

Likewise, analogously to how two or more LOOPS are connected to form a HCSSFHIL, on the next level upwards, each bit pattern that supplies input to the DC that will subsequently be recalculated to provide the output produced by its corresponding TD can, but need not, be divided into two or more HCSSFHILs.

Moreover, just as summation provides the simplest, but not the only enabling mechanism that can be used to connect multiple LOOPS to form a HCSSFHIL, the simplest way to divide a bit pattern into two or more HCSSFHILs to be followed by enabling the TD to reconnect multiple distinct smaller partial recalculated bit patterns at run time in order to losslessly recreate the original bit pattern that was first input into the DC at load time from these separate parts is to first divide the entire original bit pattern that was first input into the DC into K separate N bit long bit patterns, each of which are then processed separately as established by the DC at load time in order to be recombined via concatenation at run time by the TD. Although yet again, analogously to the combination of two or more LOOPS to produce a HCSSFHIL, as discussed above, any function that is utilized to first divide a bit pattern into to two or more HCSSFHILs whose inverse operation is then employed to recombine the resultant output at run time in order to losslessly reproduce the original bit pattern may be used in an embodiment of the current invention.

Returning to a consideration of our dual goals of compressibility and targeting, note that the requisite targeting functionality denoted in b) above, as has already been described intuitively and substantively in our prior discussion of the Turing and Dedekind methods as exposited in our initial description of the TD as well as in the prior exposition of the ability to losslessly expand a small number of parameters inside a kernel containing a small spatial footprint into a multiplicity of theoretically arbitrarily large bit patterns, by utilizing high speed processors combined with a series of equivalence relationships that this ability automatically establishes among a set of otherwise distinct separate bit patterns as the result of a separate but related functional equivalence which enables a "smoothing out" of compression ratios from a smaller number of bit patterns with extremely, theoretically arbitrarily high, compression ratios to a significantly larger number of bit patterns with slightly to somewhat smaller compression ratios as has already previously been exposited in the third of our four arguments exposing fallacies in the long accepted erroneous understanding of Kolmogorov complexity as referenced above (that can be usefully intuitively understood, as already noted, as running the basic pigeonhole principle/counting arguments backwards). Note further that these specific principles and techniques as described above are capable of being practically implemented according to the details presented directly below in order to achieve one or more embodiments of the present invention.

Consider a HCSSFHIL containing multiple LOOPS as defined above, during the process in which a DC creates them sequentially as it proceeds through successive iterations of loops and HCSSFHILs with the aim of bringing each end result bit pattern $J_a$ that it outputs with each iteration increasingly closer to the value of the DC's input bit pattern K, noting that each of the loops which comprise each HCSSFHIL can be usefully conceived of, during this process as representing generating functions or specific bit patterns with associated values or a dynamically changeable hybrid state over time, as a function of whether the totality of its internal loop parameters are constants in which case that loop outputs a bit pattern with an associated numeric value, or one or more of its parameters possibly including its loop index are variables (in which case that loop can more usefully be conceived of as a generating function) or whether the number of iterations that loop performs is determined by some other halting event e.g. an interrupt, in which case the loop functions as an ongoing generating function prior to its being halted at which point it outputs and contributes to the HCSSFHIL that it is part of, a specific bit pattern with its specific associated numeric value.

Note most importantly, furthermore, that each loop internal to a specific HCSSFHIL in addition to the HCSSFHIL that contains each of these loops manifests its own specific ACCUMULATION RATE, known to the DC and expressible in terms of known first and second and possibly higher derivatives, based upon which the CD can always alter one or more parameters within its loops, including but not limited to the index that determines when a loop halts in addition to which the DC can always add new loops with specifically chosen parameters and/or it can remove one or more loops that that HCSSFHIL already contains in manner that can always be designed to insure that the newly altered bit pattern $J_{a+1}$ that each successive newly designed "next iteration" HCSSFHIL outputs will contain an associated numeric value that is closer than the associated numeric value of its immediately prior "predecessor" bit pattern $J_a$ was to its target as determined by the unique associated value of the bit pattern K that that HCSSFHIL is attempting to best approximate as determined ultimately by both the unique associated input value corresponding to the bit pattern originally input to the DC and whether or not that the task of ever more closely approximating the associated value of the bit pattern that was originally presented as input to the DC had previously been divided up among 2 or more HCSSFHILs as discussed above.

Note next that in addition to the totality of the levers that the DC has it its disposal, including but not limited to those indicated directly above for ensuring that the associated value of each new of bit pattern $J_a$ will more closely approximate the associated value of the target bit pattern K, a variety of other tools known to those trained in the art can be utilized in order to enable the DC to step through the above iterative process still more efficiently.

Such additional refinements including but not limited to calculations designed to better approximate various intermediate target values including calculating in advance certain inverse operations e.g. taking successive roots rather than successive powers to produce better approximations and a series of various statistical and/or complex calculation optimizing methods commonly used by experimental mathematicians among others including but not limited to various integer relation detection techniques e.g. PSLQ together with various more sophisticated faster weighted average and/or truncated binary searching techniques such as those specified by Daniel J. Bernstein as specified in the course of his work on finding primes in essentially linear time are all when used in a manner obvious to those trained in the art to better optimize the operations of a DC and/or TD as described above are all to be considered to represent a component part of the present invention.

One specific such alternate embodiment of the present invention deserving mention includes the possibility of utilizing existing known standard compression methods to first better randomize bit pattern K prior to inputting it to a DC in order to create the following possible two fold advantages at the cost of the time necessary to perform such standard data compression. The advantage of bit pattern K containing a more random bit pattern includes both utilizing the increased "smoothness" of possible distribution outcomes produced by greatly reducing the likelihood that any two arbitrary bit patterns will proceed through the iterative processes described above at greatly different rates due to statistical anomalies associated with non-random bit patterns that may or may not impact positively or negatively the rate at which the aforementioned iterative process will be successfully concluded by the DC. The second potential advantage of initially randomizing the bit pattern K originally being input to the DC lies in taking positive advantage of statistical anomalies that will apply to an extremely small subset of the bit patterns which possess the requisite equivalence relationship with a given highly randomized input bit pattern K, the potential advantage of this technique being most clearly obvious in the extreme case where the original bit pattern K occupies a sufficiently small spatial footprint and/or it can be sufficiently advantageously subdivided into such smaller segments and utilizing perhaps large expensive servers with massive parallelization via extensive multi core architecture or other such methods that enable us to achieve sufficiently fast average processing speeds that would enable us to utilize the following "Roosevelt Island" method as defined and described directly below as an alternative implementation to the iterative process already described above.

Under circumstances obtaining where every statistically one-in-N random transformations of a specific bit patterns K, which we can trivially obviously be known in advance with an extremely high degree of statistical certainty, from bit pattern K's size alone under circumstances where the contents of bit pattern K are known to be highly randomly distributed, based simply on bit pattern K's Kolmogorov complexity, and furthermore under circumstances where a DC can be implemented on a computer with sufficient processing power to perform the requisite N operations and test N possible resultant bit patterns within a time frame deemed to be reasonable to perform at run time regardless of the number of and average speed of the processors as measured in objective units of time and regardless of the amount of time deemed to be reasonable (as likewise measured in any such objective units of time, e.g. seconds, years, etc.) to perform the necessary run time required by the DC to create the kernel and code which the DC is capable of performing all the operations required of it simply by performing the N random bit pattern transformations and testing as specified above until it "hits" the right one at which time it simply needs to transfer the proper code and kernel that it now has available to the TD so that the TD can execute these operations at run time.

Regarding the operations of the DC under either the extreme "Roosevelt Island" conditions or the far more commonly expected "normal" circumstances as described previously, it is generally assumed that either the "direct hit" as described above both in the exceptional "Roosevelt Island" case as well as in the far more normal general case described prior to this that the bit pattern that the DC determines to be capable of losslessly computed accurately by the TD will most typically still not exhibit an exact one to one bit to bit correspondence with the target bit pattern that had been input to the DC but rather that the difference in the associated numeric value of the bit pattern input to the DC and the output bit pattern that the DC produces and provides to the TD is sufficiently small that this numeric value which we define as the associated "Error Term" can be either directly provided as a distinct separate bit pattern with a sufficiently small spatial footprint (as a trivial consequence of its low associated numeric value) or alternatively some function of this Error Term known to the DC is capable of being provided as part of the kernel under conditions where both the function and the code needed to calculate it themselves possess a sufficiently small spatial footprint. The requisite preconditions enabling these requirements to be met will be deemed to be satisfied including under circumstances where the DC employs standard methods known to those trained in the art (e.g., when utilizing the experimental mathematical methods such as the integer relationship detection methods referenced previously) in order to uncover the function needed to effectively encode the Error Term as described above and likewise other such methods known to those trained in the art may be utilized by the DC in enabling embodiments of this invention in order to represent the Error Term directly, or indirectly via the use of a function, in a manner that makes use of other known methods to further reduce the size of the spatial footprint required to represent the Error Term inside the kernel. To provide one such simple example, consider an implementation of the DC on a large server making extensive use of numerous cores in a multi core architecture and/or other means of providing highly efficient rapid parallelization providing an N fold parallel processing capability that incur no associated problems related to functional dependencies and consider furthermore that in the course of its normal functioning that this same server will be utilized to implement the TD at run time and that that TD will in the course of implementing the operations that the DC provides it rapidly execute M operations on each of its N available parallel processing nodes a smaller fractional part X equal to $1/MN$ times the error term and/or some still smaller function thereof can be stored in the kernel enabling the TD to recalculate the bit pattern that was originally input into the DC losslessly at run time.

As already specified an additional series of methods satisfying the dual requisite high compressibility and accurate targeting functionalities performed by the DC at load time and executed by the TD at run time (and specified as 'a)' and 'b)' previously in the above exposition) represent an important aspect of the present invention. These additional methods, described directly herein, which utilize alternative means of further distinguishing two or more distinct informational contents despite the fact that they both exhibit identical bit patterns that they share in common which, as was previously noted in passing, above in the section referencing the first of four commonly accepted fallacies regarding Kolmogorov complexity, constitute alternate embodiments of the present invention under circumstances where each of these embodiments can be implemented independently but where the preferred enabling embodiment of the present invention utilizes both of these methods.

Moreover, as indicated in this exposition in a manner usefully understandable to those in the art, a wide variety of known techniques including but not limited to various arithmetic value calculation based and statistical techniques together with techniques taken from the field of experimental mathematics enable the DC to utilize a relatively large set of more precise targeting techniques based on its extensive knowledge of the problem at hand as described elsewhere below in this exposition in further detail. These techniques including for example the use of such techniques as PSLQ (an abbreviation that derives from its usage of a partial sum of squares vector and a LQ (lower-diagonal-orthogonal)

matrix factorization) and other integer relationship detection methods as already referenced cannot only be usefully applied to such tasks as further lowering the spatial footprint of error term inside the kernel but can also be used to find more efficient paths plowing through multiple iterations as described herein of getting a series of $J_a$ terms specific to an individual LOOP or HCSSFHIL to more efficaciously approach some target K. Based on such more in depth knowledge as revealed by such methods the DC may employ one or more iterations in which two or more successive $J_a$'s may temporarily move further away from K in order to find a path which under these specific circumstances known to the DC approaches K more quickly than it would if it had utilized a more direct route. Note in this connection that when we wrote earlier in this exposition of the ability of the DC to always find a series of successive $J_a$'s that more and more closely approach K we were referencing a significant true principle with important implications for the DC's ability to perform critical useful operations to achieve its goals, but nothing in that exposition should be interpreted as preventing the DC from utilizing a more optimized path to greatly lowering to distance between J and K to the point where it can be represented directly by a sufficiently small error term that involves the DC from purposefully choosing two or more successive iterations as described above that temporarily increase the absolute value of the difference between J and K.

And still other typically often specifically opportunistic means of achieving a still smaller spatial footprint and/or means of further speeding up recalculations and/or other processing and/or other means of implementing these methods and/or apparatuses that are obvious and/or are already known to those trained in the art when used in conjunction with the methods and/or apparatuses of the present invention as described herein are also to be considered as part of the present invention. Such methods include but are not at all limited to methods specified above that make use of the large quantity of precisely accurate statistical data that the DC has available to it, including for example both knowledge of each subsection of the bit pattern originally input to it and different ways of slicing and dicing it capable of producing different associated numeric values and other such obviously useful logical bit-wise determination properties of each of its distinct separate segments under these multiple possible slicing and dicing operations together with complete knowledge of the numeric value of the distance between each of these parts and a large collection of known highly compressible small spatial footprint known generating functions whose varying accumulation rates are also known to the DC and which can be asymptotically goal directedly modified however the DC finds most useful as described above. But this is not nearly exhaustive of the types of tools that the DC has available at its disposal.

Consider, for example, the use of one of the key methods utilized by the present invention of denoting substantive informational content through alternate means other than bit patterns of distinguishing the underlying informational contents between two or more bit patterns that are otherwise bit-wise identical such as via virtual memory addresses, time stamps, and/or other criteria. These additional methods described below include but are not limited to methods through which these alternate means of representing informational content and/or distinguishing the data representational functionality of two or more otherwise identical bit patterns are achieved through access to a large repository of bit patterns corresponding to associated numeric vales and/ or functions of those values that are represented in, calculated by, and/or are in other ways found to be contained within and/or "spit out" by metadata and/or other house-keeping or other tasks that form some component part of ongoing computer functioning and/or auxiliary data process-ing operations as referenced above and described in further detail shortly below. Such means of representing informa-tional content can frequently be represented via multiple pointers, mappings, and/or other content labeling, content referencing and/or content identifying denotations and/or procedures that serve substantially similar and/or identical useful functional purposes but whose spatial footprint is often quite different. Consider for example a small series of time stamps and/or virtual memory addresses that are them-selves 64 bit entities but which can be uniquely identified by their ordinal order or their position in a list and/or by some other pointer mechanism including for example by a recur-sive systems of pointers and/or mappings that can be used to uniquely identify specific data items where these pointing or other such functional entities can often be represented by different length pointers as a function for example of the number of different items being pointed to at different levels within a larger more complex hierarchy. Consider for example a list of a dozen pointers pointing to a larger series of 250 pointers pointing to a ordered list of 64 k different unique virtual memory addresses thereby enabling a 4 bit pointer to point to an 8 bit pointer to point to a unique number which can represent any value as predetermined by the DC between zero and $2^{64}$ choose 64 k times 64 k factorial. Utilizing these and/or other similar methods to further decrease the requisite spatial footprint of the kernel all serve to constitute further enabling embodiments of methods of the present invention. Likewise many such other opportunities such as for example advantageously utilizing different interrelated complex mappings manifest in the ongoing functioning of a shared memory system and/or different complex unique combinatorial mappings that derive from the use of different types of associative or non-associative on chip caches, and/or specifying the numeric value of a large bit pattern or some number that can be functionally used to uniquely identify a large bit pattern via for example calculating some function of the differences between multiple significant 32 bit segments of a relatively small list of 64 bit time stamps which are uniquely specified to the TD by their respective positions or some function of their respective positions within a relatively short ordered list, which operations are capable of being performed repeat-edly and possibly recursively within multiple single or nested loops, all of which together with numerous other similar and/or analogous methods known to or easily dis-coverable by those trained in the art provide further means of further lowering the spatial footprint of the kernel which further constitute novel methods representing component aspects of the present invention.

As already specified such additional methods that utilize alternate means of distinguishing two or more bit patterns based despite the fact that they that they exhibit bit-wise identical bit patterns feature of the present invention. As already indicated they provide both greater compressibility and more efficient targeting and they can provide both of these advantages both in enabling the series of J's converge more efficiently on K as described above and likewise in representing our error term more efficiently. And these methods as already shown provide these improvements, most importantly when operating on two very different types of bit patterns which we can usefully categorize as 'DID' and 'C' as defined directly below, where 'DID' represents a very large number of very long, possibly arbitrarily large bit patterns (such as those output from our highly compressed generating functions described above) at the cost of con-taining significant discontinuities whereas 'C' represents useful 'filler' bit patterns to more efficiently deal with the impact of these discontinuities based on their ability to take on any arbitrary value or any arbitrary function of any arbitrary value with no discontinuities within a significant range between a and b as exhibited by the fact that in the course of its normal operations computers produce numer-ous arbitrary bit patterns in ways already indicated while time stamps and virtual memory addresses for example can be 'preset' to any 64 bit value with no discontinuities with the significance of these distinctions and the distinct effi-ciency capabilities each provide being evident to those trained in the art.

The ability to determine which specifically valued memory addresses and time stamps for example among other metadata are associated with or assigned to which specific data items and operations was previously prohibited by the reality that moving, manipulating and utilizing large bit patterns in modern computer systems (as opposed to rapidly recalculating those bit patterns from a kernel that is already entirely or almost entirely resident in on chip cache, which this invention enables) is a sufficiently arduously highly inefficient process to necessitate the existence of complex time consuming routines that are typically performed by some component of the operating system and/or other sys-tem software or in some processes still further down, closer to the hardware and more inaccessible that are specifically designed to best optimize all such aspects of computer operations including at what virtual memory addresses dif-ferent data is least inefficiently stored and in at what time and in what time sequence data processing operations are best performed on that data. Freed from these constraints the DC ability to assign things like virtual memory addresses, time stamps and other metadata parameters known to the system to specific bit patterns with specifically chosen associated values that are then utilized as part of the data recalculation performed by the TD in ways that provide at least all of the following major advantages:

a) The obvious compressibility and targeting advantages self-evident to those trained in the art which enable the TD to perform its calculations significantly more rapidly with a considerably smaller spatial footprint, already explicated including with examples above. In implementations where the DC is resident on one computer, e.g. a server, and the TD is resident on another computer, e.g., a client, that similar advantages can be provided during the data transmission process in a manner knowable to those trained in the art by utilizing specifically chosen aspects of the network trans-mission, e.g., frequency, signal intensity, transmission speed changes, etc., to encode such information.

b) This aspect of the present invention provides an ability to implement real time updates (a capability not present in traditional data compression) in so far as the final output value of a bit pattern is via dependent in part on such factors as virtual memory addresses and/or time stamps and/or functions thereof, in a deterministic manner known to the DC, making quick on the fly changes to certain segments of a large bit stream can be achieved by changing the values of the associated virtually memory address and/or time stamps and/or other metadata repositories and/or functions thereof in a manner that causes the TD to output the newly changed bit pattern. Note that while this method utilizes the under-lying functional bi-directional equivalence between storage and processing in the reverse direction (i.e., via altering a storage location to change a data value) there is no need to actually move any bit patterns physically as the appropriate changes can be accommodating via the DC altering the tag information for example in the case of changing a virtual memory address assignment to update a data value.

Such changes in for example 64 bit entities representing virtual memory addresses, time stamps or other metadata can by utilized for indexing purposes providing an ability to access part of the overall bit pattern starting or stopping at arbitrarily designated points. Note that this can be accomplished utilizing either a subset of the bit patterns in for example a 64 bit entity such as a virtual memory address or time stamp or some other metadata repository and/or it can be represented positionally and/or some combination thereof which can be useful for example in performing such indexing in a manner that accommodates two or more independent indexing criteria. Consider for example that it would require 14 bits to differentiate every second (which could be used to denote any arbitrarily chosen starting and/or stopping point) in a four and a half hour long movie. Thus if one wanted to search for a starting point corresponding to a correspondingly sized fractional part as in this example (note the advantage of both the DC—and the TD—knowing all the derivatives of each of its subsections and likewise a possible further advantage of randomization), rather than traversing the on chip cache sequentially from start to finish one would go directly to the cache position starting with the cache line that was stored at a virtual memory address containing the proper associated 14 bit segment within its virtual memory address (a task that could easily be expedited by choosing an associating caching scheme that was designed to facilitate these sort of searches). Moreover, alternatively based on knowing all the derivatives and the degree of smoothness of the accumulation rate one could calculate the proper starting point positionally without such an index and alternatively a hybrid mechanism could be utilized accommodating the ability to search positionally for a specific sub-location at some specific position within a cache line.

Note that when not being used for these purposes that positional information can be used for other purposes including more efficiently encoding information. Under conditions for example where fixed or at least known sized units are being processed by a commutative operation the end result of that computation will be order invariant permitting the order the DC places the units in according to some ordering principle (e.g., the associated numeric value of that subsection of the appropriate length within that binary bit pattern) and then encoding further information based upon which of the N! possible permutational orderings was in fact chosen.

Further, note that while the definition above specifies a case in which each bit pattern input into the DC is represented by one or more HCSSFHILs and each HCSSFHIL is represented by two or more LOOPS a case in which the entire input bit pattern is capable of being recalculated from a single loop is also to be considered an embodiment of this invention.

Figure 3A:
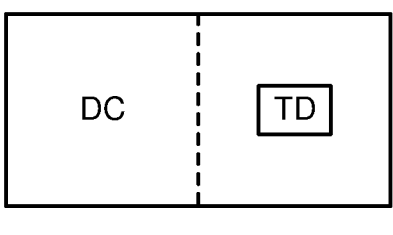
FIGS. 3($a$), 3($b$) and 3($c$) show multiple possible implementations of a Data Compiler (DC) and Turing Dedekind device (TD).
Figure 3B:
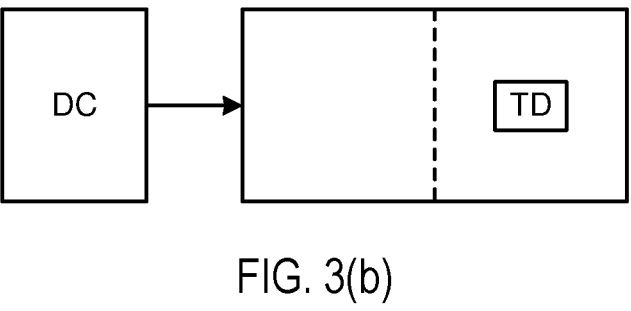
Figure 3C:
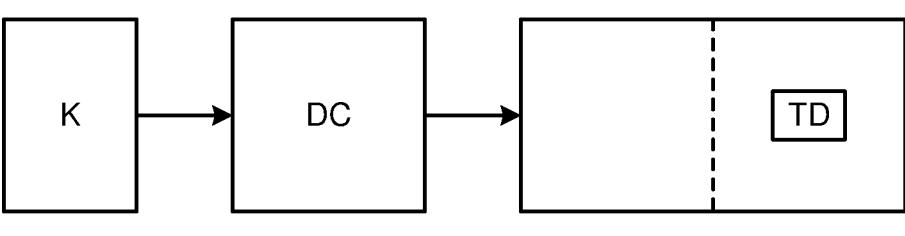

FIGS. 3(a), 3(b) and 3(c) show multiple possible implementations of a DC and TD. FIG. 3(a) shows a DC and the corresponding TD residing mainly or totally in the on chip cache on a single computer in which the DC established (at load time) the processing operations and the data parameters that form the kernel that the TD will operate upon to rapidly losslessly reproduce the bit pattern originally input into the DC. FIG. 3(b) shows the same functionality achieved with the DC residing on one machine (e.g., a server) and while TD containing the kernel resides mainly or totally in the on chip cache of a separate machine (e.g., a client). FIG. 3(c) is distinguished from FIG. 3(b) in that the bit pattern that provides the input to the DC originates from a machine other than the server from another machine that may or may not be a client.

Figure 4:
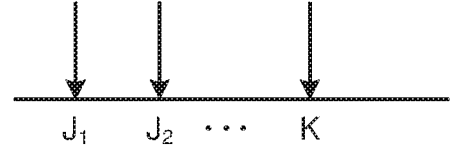
FIG. 4 shows a vector providing both a visual representation of the combinatorial complexity of any size N bit pattern for all N which also provides a template illustrating N different but related sets of operations performed by both the DC at load time and the TD at run time.

FIG. 4 shows a vector providing both a visual representation of the combinatorial complexity of any size N bit pattern for all N which also provides a template illustrating N different but related sets of operations performed by both the DC at load time and the TD at run time. The vector itself contains a conceptual representation of every possible bit content that can be represented a size N bit pattern, e.g., it contains $2^{8N}$ elements starting with all zeros and ending with all ones in which the associated numeric value of each element is equal to the associated numeric value of the bit pattern immediately preceding it plus one. One such bit pattern represented some place on a line segment corresponding to this vector designated as K represents the particular bit pattern being input to the DC at load time which likewise corresponds exactly to the bit pattern that is output by the TD at run time. Both the DC and the TD typically produce a series of other distinct size N bit patterns that are designed to increasingly approximate the numeric value of bit pattern K, each of which is designated by a particular $J_a$. The successive J values produced by the DC are typically altered iteratively whereas the last set of $J_a$'s produced by the DC correspond to the $J_a$'s that are utilized by the TD.

Figure 5:
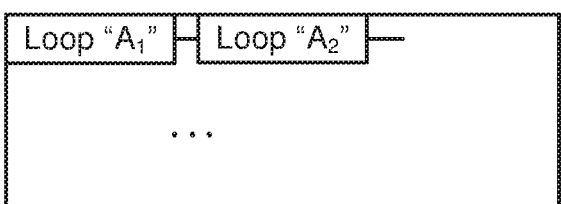
FIG. 5 illustrates a HCSSFHIL showing that it is composed of two or more LOOPS each of which represents generating functions that produced output bit patterns containing the characteristics which qualify it as a HCSSFHIL as represented by HCSSFHIL's descriptive name. These loops are connected by one or more different operations that can represent addition or any other function.

FIG. 5 illustrates a HCSSFHIL showing that it is composed of two or more LOOPS each of which represents generating functions that produced output bit patterns containing the characteristics which qualify it as a HCSSFHIL as represented by HCSSFHIL's descriptive name. These loops are connected by one or more different operations that can represent addition or any other function.

Figure 6:
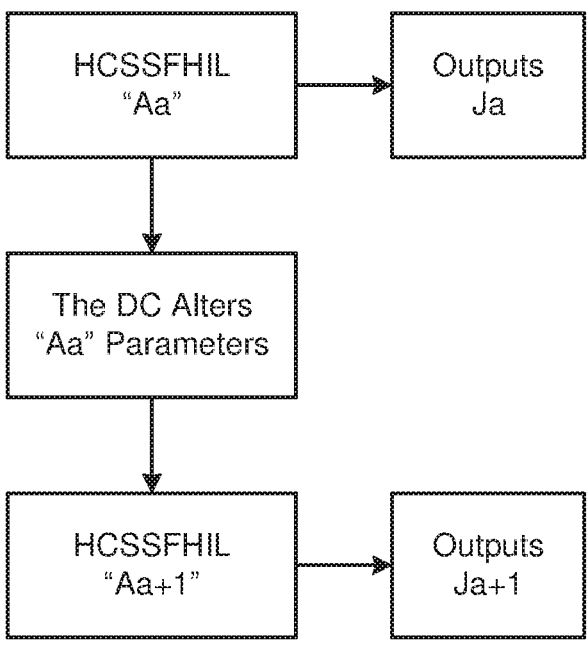
FIG. 6 illustrates how sequentially iterating HCSSFHILs are produced by the DC with each HCSSFHIL outputting a particular J value which then gets altered to produce the next HCSSFHIL which outputs the next J value.

FIG. 6 illustrates how sequentially iterating HCSSFHILs are produced by the DC with each HCSSFHIL outputting a particular J value which then gets altered to produce the next HCSSFHIL which outputs the next J value.

Figure 7:
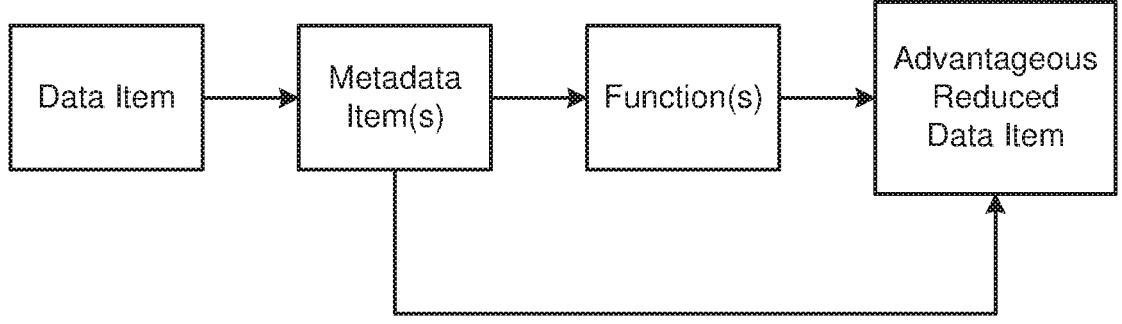
FIG. 7 illustrates how the DC utilizes metadata items including but not limited to virtual memory addresses and or time stamps to transform some or all of its parameters possibly including representation of its error term to lower the spatial footprint and or increase the calculating power of the parameters that the TD will actually store and utilize via a method in which one or more of these parameters are themselves recalculated from bit patterns contained in virtually memory addresses, time stamps and or other metadata and or from functions of bit patterns contained in virtually memory addresses, time stamps and or other metadata.

FIG. 7 illustrates how the DC utilizes metadata items including but not limited to virtual memory addresses and or time stamps to transform some or all of its parameters possibly including representation of its error term to lower the spatial footprint and or increase the calculating power of the parameters that the TD will actually store and utilize via a method in which one or more of these parameters are themselves recalculated from bit patterns contained in virtually memory addresses, time stamps and or other metadata and or from functions of bit patterns contained in virtually memory addresses, time stamps and or other metadata.

Figure 8:
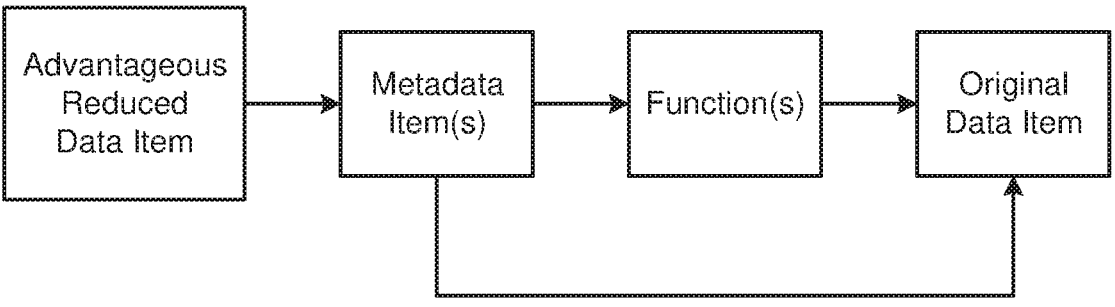
FIG. 8 illustrates how the TD implements the analogous operations at run time.

FIG. 8 illustrates how the TD implements the analogous operations at run time. As such, it represents the inverse operations illustrated in FIG. 7 so that the output of FIG. 8 corresponds exactly to the input of FIG. 7 and the input of diagram 6 corresponds exactly to the output of FIG. 7.

Figure 9:
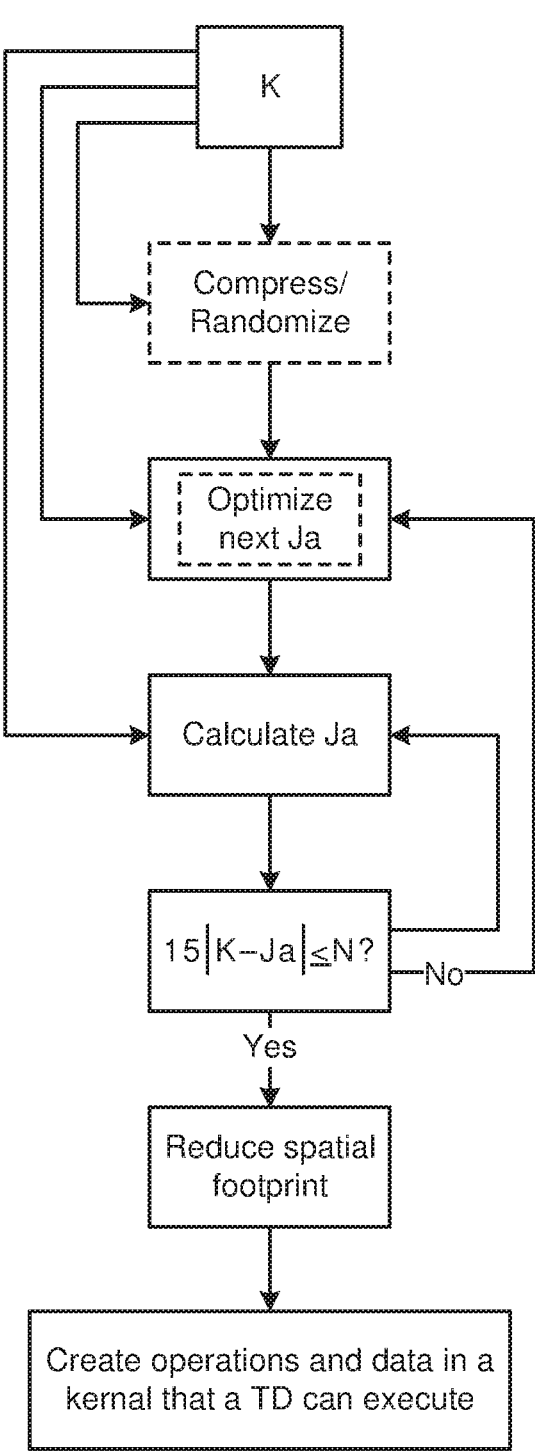
FIG. 9 represents the iterative steps described in these specifications showing step by step how the DC starting form an input bit pattern K executes a series of iterative steps the produce the DC's output in the form of the kernel that it hands to the TD.

FIG. 9 represents the iterative steps described in these specifications showing step by step how the DC starting from an input bit pattern K executes a series of iterative steps that produce the DC's output in the form of the kernel that it hands to the TD. Steps one and two representing initially randomizing bit pattern K through the application of for example traditional compression methods and procedures that the DC may or may not employ to optimize the first iteration of calculating its initial J value. The DC then iterates through the various steps illustrated here to provide a series of additional J values whose aim is to more closely approximate the original bit pattern K. The DC tests at each stage whether it is sufficiently close according to its internal testing criteria after which it may or may not implement the further steps illustrated in FIG. 7 to further improve the efficiency of the operations and or data that will form the kernel that the TD will implement including by still further lowering its spatial footprint.

The invention claimed is:

1. A computer-based method of generating a formula used to generate a target bit pattern, the method comprising:

generating an initial bit pattern from a target bit pattern;

generating information content and specific virtual memory addresses from the initial bit pattern;

assigning the specific virtual memory addresses to respective portions of the informational content, the specific virtual memory addresses corresponding to cache lines;

generating a formula that operates on at least the initial bit pattern to re-generate the target bit pattern, such that the file size of the formula and the informational content together is smaller than the file size of the target bit pattern; and storing the formula, the informational content and the specific virtual memory addresses for processing by a receiver system.

2. A computer-based method of using an initial bit pattern to generate a target bit pattern, the method comprising:

receiving a formula configured to operate on an initial bit pattern to generate a target bit pattern;

reading informational content from cache lines having virtual memory addresses assigned to the cache lines;

generating the initial bit pattern from at least the informational content and the virtual memory addresses; and using the formula to process at least the initial bit pattern to generate the target bit pattern.

\* \* \* \* \*